(12) United States Patent
Li et al.

(10) Patent No.: US 10,840,475 B2
(45) Date of Patent: Nov. 17, 2020

(54) PACKAGE FILM AND MANUFACTURING METHOD THEREOF, AND PACKAGING METHOD FOR OLED PANEL

(71) Applicant: Shenzhen China Star Optoelectronics Semiconductor Display Technology Co., Ltd., Shenzhen (CN)

(72) Inventors: Wenjie Li, Shenzhen (CN); Jinchuan Li, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 306 days.

(21) Appl. No.: 15/742,526

(22) PCT Filed: Jul. 13, 2017

(86) PCT No.: PCT/CN2017/092875
§ 371 (c)(1),
(2) Date: Jan. 8, 2018

(87) PCT Pub. No.: WO2018/214257
PCT Pub. Date: Nov. 29, 2018

(65) Prior Publication Data
US 2018/0375060 A1    Dec. 27, 2018

(30) Foreign Application Priority Data
May 26, 2017    (CN) .......................... 2017 1 0386498

(51) Int. Cl.
*H01L 51/52*    (2006.01)
*H01L 51/56*    (2006.01)
(Continued)

(52) U.S. Cl.
CPC ...... *H01L 51/5246* (2013.01); *H01L 51/5256* (2013.01); *H01L 51/5259* (2013.01);
(Continued)

(58) Field of Classification Search
CPC ..... B32B 9/007; B32B 9/045; B32B 2250/42; B32B 2313/04; B32B 2315/10;
(Continued)

(56) References Cited

U.S. PATENT DOCUMENTS

| 2006/0093795 | A1* | 5/2006 | Wang | .................. | B01D 53/261 |
| | | | | | 428/195.1 |
| 2014/0252325 | A1* | 9/2014 | Kim | ................... | H01L 51/5259 |
| | | | | | 257/40 |
| 2014/0353594 | A1* | 12/2014 | Zeng | ................... | H01L 27/3225 |
| | | | | | 257/40 |

FOREIGN PATENT DOCUMENTS

| CN | 102569674 A | 7/2012 |
| CN | 103199199 A | 7/2013 |

(Continued)

OTHER PUBLICATIONS

Machine translation of CN 104347820. (Year: 2015).*

*Primary Examiner* — John D Freeman
(74) *Attorney, Agent, or Firm* — Leong C. Lei

(57) ABSTRACT

The invention provides a package film, manufacturing method thereof, and packaging method for OLED panel. The package film comprises a polymer substrate, at least two organic buffer layers, and at least two inorganic barrier layers; with a single layer of the organic buffer layer and a single layer of the inorganic barrier layer being alternately stacked on the polymer substrate; the inorganic barrier layer formed with one or more materials from graphene film, mica sheet film, and carbon nanotube film to achieve a package film with transmittance, high barrier, and high flexibility, reduces the device oxygen permeability and reduce the (Continued)

package film thickness, make the device thinner, and meet the packaging requirements for flexible OLED panel; moreover, by disposing water absorption layer and water barrier layer in organic buffer layer at periphery to enhance the package film structure from lateral side to further improve water and oxygen barrier ability.

9 Claims, 7 Drawing Sheets

(51) Int. Cl.
*B32B 9/00* (2006.01)
*B32B 19/04* (2006.01)
*H01L 51/00* (2006.01)
*B32B 9/04* (2006.01)

(52) U.S. Cl.
CPC .............. *H01L 51/56* (2013.01); *B32B 9/007* (2013.01); *B32B 9/045* (2013.01); *B32B 19/045* (2013.01); *B32B 2250/42* (2013.01); *B32B 2313/04* (2013.01); *B32B 2315/10* (2013.01); *H01L 51/0097* (2013.01); *H01L 2227/326* (2013.01); *H01L 2251/5338* (2013.01)

(58) Field of Classification Search
CPC ....... H01L 2227/326; H01L 2251/5338; H01L 51/0097; H01L 51/5246; H01L 51/5256; H01L 51/5259; H01L 51/56
See application file for complete search history.

(56) References Cited

FOREIGN PATENT DOCUMENTS

| CN | 103325953 A | 9/2013 |
|---|---|---|
| CN | 104347820 A | 2/2015 |
| CN | 104518128 A | 4/2015 |
| CN | 104576970 A | 4/2015 |

\* cited by examiner

PACKAGE FILM AND MANUFACTURING METHOD THEREOF, AND PACKAGING METHOD FOR OLED PANEL

BACKGROUND OF THE INVENTION

1. Field of the Invention

The present invention relates to the field of panel display techniques, and in particular to a package film and manufacturing method thereof, and packaging method for OLED.

2. The Related Arts

The organic light-emitting display (OLED) devices have the advantages of active-luminous, low driving voltage, high emission efficiency, fast response, high contrast and clarity, near 180° viewing angle, wide temperature range, ability to realize flexible and large-size full-color display, and so on, are considered the emerging applications technology for the next generation display devices.

Unlike the conventional liquid crystal display (LCD) technology, the OLED display technology does not need backlight and uses ultra-thin organic material coating and glass substrate. The organic material emits light when a current flows through. However, because the organic material is easy to react with water or oxygen, the OLED display, as a display device based on the organic material, poses high requirements on the packaging. Thus, the encapsulation of OLED devices to improve the internal seal of the device, for insulation from the external environment as far as possible, is essential for stable emission for OLED devices.

The current OLED device package mainly uses packaging glue on a rigid packaging substrate (such as, glass or metal), but this approach is not applicable to flexible devices. Therefore, there are technical solutions by stacking thin films to encapsulate the OLED device. The thin film encapsulation usually forms two barrier layers of inorganic materials with good water barrier property over the OLED device on the substrate. A buffer layer of organic material with good flexible and durable property is formed between the two barrier layers. Specifically, refer to FIG. 1 for an OLED display packaged in thin film, comprising: a substrate 100, an OLED device 200 disposed on the substrate 100, a thin film package layer 300 formed on the OLED device 200, wherein the thin film package layer 300 comprises: a first inorganic barrier layer 310, an organic buffer layer 320 formed on the first inorganic barrier layer 310, and a second inorganic barrier layer 330 formed on the organic buffer layer 320.

Another thin film packaging technology is atomic layer deposition (ALD). The thin film prepared by using ALD technology has a high film density and less defects; but the entire production process requires a vacuum environment, and the film growth rate is very slow. In addition, the flexibility of the inorganic film is poor, and a low temperature must be used when depositing the thin film on the OLED to reduce the damage to the light-emitting material.

For flexible OLED device packaging, the commercialization requirements for the device life span and stability are: the water vapor transmission rate of less than $10^{-6}$ g/m²/day, and the oxygen permeability of less than $10^5$ cc/m²/day (1 atm). Therefore, the packaging process plays an important role in the production of OLED devices, and is one of the key factors affecting product yield. The issue of how to use convenient and efficient means to prepare flexible OLED packaging film has become a near-term research focus. A metal film packaging can achieve lower water vapor transmission rate, but the opaque property of metal regarding light also limits application scope.

SUMMARY OF THE INVENTION

The object of the present invention is to provide a package film, with the inorganic barrier layer selected from one or more of the graphene film, the mica film, and the carbon nanotube film, thereby achieving high transmittance, high barrier properties, and high flexibility of the package film, and reducing the oxygen permeability of the device as well as reducing the thickness of the package film, making the device thinner, and to meet the flexible OLED panel packaging requirements.

Another object of the present invention is to provide a manufacturing method of package film, able to manufacture package film with high transmittance, high barrier properties, and high flexibility of the package film, and reducing the oxygen permeability of the device as well as reducing the thickness of the package film, making the device thinner, and to meet the flexible OLED panel packaging requirements.

Yet another object of the present invention is to provide a packaging method for OLED panel, by using the above package film, capable of reducing the oxygen permeability of the device as well as reducing the thickness of the package film, making the device thinner, and to meet the flexible OLED panel packaging requirements.

To achieve the above object, the present invention provides a package film, comprising: a polymer substrate, at least two organic buffer layers, and at least two inorganic barrier layers;

wherein a single layer of the organic buffer layer and a single layer of the inorganic barrier layer being alternately stacked on the polymer substrate;

each organic buffer layer disposed in turn outwardly with a circle of water absorption layer and a circle of water barrier layer on periphery;

the inorganic barrier layer being formed with one or more materials selected from graphene film, mica sheet film, and carbon nanotube film; the organic buffer layer being formed with a material having a viscosity, and the inorganic barrier layer being adhered to the polymer substrate through the viscosity of the organic buffer layer.

According to a preferred embodiment of the present invention, the organic buffer layer is formed with a solid film or glue;

the solid film is a pyrolytic tape, or a PSA type film, and the glue comprises one or more of PMMA, PS, PDMS, and PVA.

According to a preferred embodiment of the present invention, the water absorption layer is made of calcium oxide; and the water barrier layer is made of PDMS glue, or DAM glue.

According to a preferred embodiment of the present invention, the polymer substrate is made of PI, PEN, PET, PBT, PMMA, PS, COP, or FRT.

According to a preferred embodiment of the present invention, the water absorption layer and the water barrier layer are formed by nozzle printing.

According to a preferred embodiment of the present invention, the organic buffer layer has a thickness of 500-9000 nm;

the inorganic barrier layer has a thickness of 100-5000 nm;

the water absorption layer has a thickness of 100-5000 nm;

the water barrier layer has a thickness the same as the thickness of the water absorption layer.

The present invention also provides a manufacturing method of package film, comprising the steps of:

Step S1: providing a polymer substrate;

Step S2: forming an organic buffer layer having viscosity on the polymer substrate, forming a circle of water absorption layer and a circle of water barrier layer in turn outwardly on periphery of the organic buffer layer;

Step S3: forming an inorganic barrier film, using the viscosity of the organic buffer layer to adhere the inorganic barrier film to the polymer substrate, and forming an inorganic barrier layer on the organic buffer layer, the water absorption layer and the water barrier layer;

Step S4: repeating Steps S2 and S3 at least once to obtain the package film.

According to a preferred embodiment of the present invention, in Step S2, the organic buffer layer is formed with a solid film, the solid film is a pyrolytic tape, or a PSA type film, and the organic buffer layer is formed by direct adherence of a film; or, the organic buffer layer is formed with a liquid glue, the glue comprises one or more of PMMA, PS, PDMS, and PVA, the organic buffer layer is formed by a coating process, and the coating process is a jet dispensing process, a spin coating process, a screen printing process, or an ink-jet printing process.

The present invention also provides a packaging method for OLED panel, comprising the steps of:

Step S100: providing a substrate, forming an OLED device on the substrate to obtain an OLED substrate;

Step S200: coating a filling glue on the substrate and the OLED device to form a filling glue layer, disposing a circle of DAM glue on the substrate surrounding periphery of the OLED device; or, forming a layer of double-sided glue layer on the substrate and the OLED device;

Step S300: providing the above package film, and aligning and attaching the package film and the OLED substrate, at this point, the polymer substrate of the package film being at uppermost layer of the OLED device, and the inorganic barrier layer at lowermost layer being separated from the OLED device by the filling glue layer or the double-sided glue layer;

then, performing UV irradiation on the DAM glue surrounding the periphery of the OLED device to cure the DAM glue to obtain a sealant, or the package film being adhered to the OLED substrate by the double-sided glue layer, so as to complete packaging the OLED panel.

Compared to the known techniques, the present invention provides the following advantages. The package film of the present invention comprises a polymer substrate, at least two organic buffer layers, and at least two inorganic barrier layers; with a single layer of the organic buffer layer and a single layer of the inorganic barrier layer being alternately stacked on the polymer substrate; each organic barrier layer being disposed in turn outwardly with a circle of water absorption layer and a circle of water barrier layer on periphery; the inorganic barrier layer being formed with one or more materials selected from graphene film, mica sheet film, and carbon nanotube film; the organic buffer layer being formed with a material having a viscosity, and the inorganic barrier layer being adhered to the polymer substrate through the viscosity of the organic buffer layer; the present invention utilizes the excellent optical properties and high density of a graphene film, a mica film, and carbon nanotubes film to achieve an excellent-performance package film with transmittance, high barrier, and high flexibility, reduces the device oxygen permeability as well as reduce the package film thickness, to make the device thinner, and to meet the packaging requirements for flexible OLED panel; moreover, by disposing a circle of water absorption layer and a circle of water barrier layer in each organic buffer layer at periphery to enhance the structure of the package film from the lateral side to further improve water and oxygen barrier ability. The manufacturing method of package film of the present invention is, able to manufacture package film with high transmittance, high barrier properties, and high flexibility of the package film, and reducing the oxygen permeability of the device as well as reducing the thickness of the package film, making the device thinner, and to meet the flexible OLED panel packaging requirements. The packaging method for OLED pane of the present invention is, by using the above package film, capable of reducing the oxygen permeability of the device as well as reducing the thickness of the package film, making the device thinner, and to meet the flexible OLED panel packaging requirements to overcome the disadvantages of the conventional thin film packaging and further protects the device.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technique means and effect of the present invention, the following uses preferred embodiments and drawings for detailed description.

Figure 1:
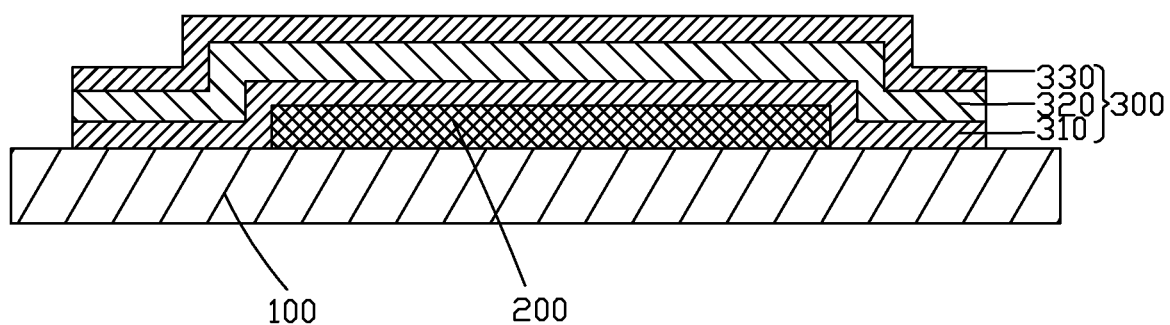
FIG. 1 is a schematic view showing a the structure of an OLED display with known thin film packaging technology.
Figure 2:
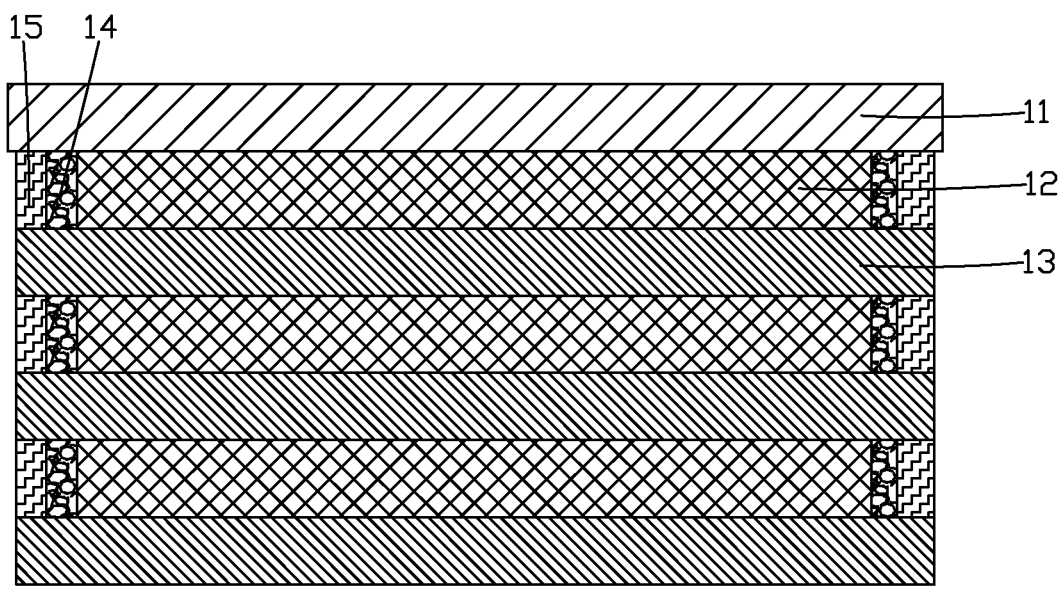
FIG. 2 is a schematic view showing the structure of a package film provided by an embodiment of the present invention.

Referring to FIG. 2, the present invention provides a package film, comprising: a polymer substrate 11, at least two organic buffer layers 12, and at least two inorganic barrier layers 13;

wherein a single layer of the organic buffer layer 12 and a single layer of the inorganic barrier layer 13 being alternately stacked on the polymer substrate 11;

each organic buffer layer 12 disposed in turn outwardly with a circle of water absorption layer 14 and a circle of water barrier layer 15 on periphery;

the inorganic barrier layer 13 being formed with one or more materials selected from graphene film, mica sheet film, and carbon nanotube film; the organic buffer layer 12 being formed with a material having a viscosity, and the inorganic barrier layer 13 being adhered to the polymer substrate 11 through the viscosity of the organic buffer layer 12.

Specifically, the organic buffer layer 12 is formed with a solid film or glue; wherein the solid film is a pyrolytic tape, or a pressure sensitive (PSA) type film, and the glue comprises one or more of polymers, such as, polymethylmethacrylate (PMMA), polystyrene (PS), polydimethylsiloxane (PDMS), and poly Vinyl alcohol (PVA).

Specifically, the water absorption layer 14 is mainly made of calcium oxide, with water absorption capacity reaching 5-10%.

Specifically, the water barrier layer 15 is made of an organic polymer having a high transmittance and having hydrophobicity, such as PDMS glue or DAM glue (cofferdam glue available in the market).

Specifically, the polymer substrate 11 has a transmittance of >98% for visible light; the polymer substrate 11 is made of hydrocarbons, esters, or amide polymers, such as polyimide (PI), polyethylene naphthalate (PEN), poly (terephthalic acid), ethylene glycol (PET), polybutylene terephthalate (PBT), PMMA, PS, cycloolefin polymer (COP), or thermoplastic composite (FRT).

Specifically, the water absorption layer 14 and the water barrier layer 15 are formed by nozzle printing.

Specifically, the organic buffer layer 12 has a thickness of 500-9000 nm.

Specifically, the inorganic barrier layer 13 has a thickness of 100-5000 nm.

Specifically, the water absorption layer 14 has a thickness of 100-5000 nm.

Specifically, the water barrier layer 15 has a thickness of 100-5000 nm, the same as the thickness of the water absorption layer 14.

Specifically, the package film comprises 2-5 organic buffer layers 12 and 2-5 inorganic barrier layers 13.

The present invention utilizes the excellent optical properties and high density of a graphene film, a mica film, and carbon nanotubes film for use as the inorganic barrier layer 13 to achieve an excellent-performance package film with transmittance, high barrier, and high flexibility, reduces the device oxygen oxygen permeability as well as reduce the package film thickness, to make the device thinner, and to meet the packaging requirements for flexible OLED panel; moreover, by disposing a circle of water absorption layer 14 and a circle of water barrier layer 15 in each organic buffer layer 12 at periphery to enhance the structure of the package film from the lateral side to further improve water and oxygen barrier ability.

In a preferred embodiment of the package film of the present invention, the package film comprises three organic buffer layers 12 and three inorganic barrier layer 13; among the three inorganic barrier layers 13, the middle layer is a mica film and the other two layers are graphene films.

Figure 3:
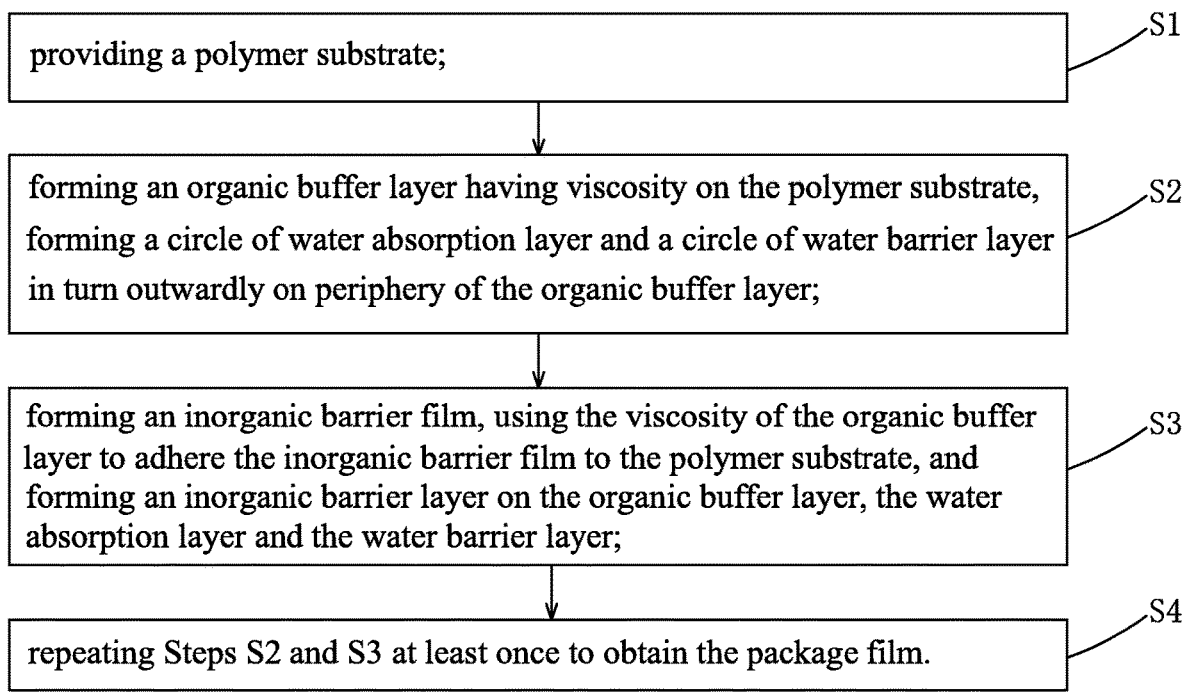
FIG. 3 is a schematic views showing a flowchart of manufacturing method of package film provided by an embodiment of the present invention.

Based on the above package film, referring to FIG. 3, the present invention also a manufacturing method of OLED panel, comprising the steps of:

Step S1: providing a polymer substrate 11.

Specifically, the polymer substrate 11 has a transmittance of >98% for visible light; the polymer substrate 11 is made of hydrocarbons, esters, or amide polymers, such as polyimide (PI), polyethylene naphthalate (PEN), poly (terephthalic acid), ethylene glycol (PET), polybutylene terephthalate (PBT), PMMA, PS, cycloolefin polymer (COP), or thermoplastic composite (FRT).

Figure 4:
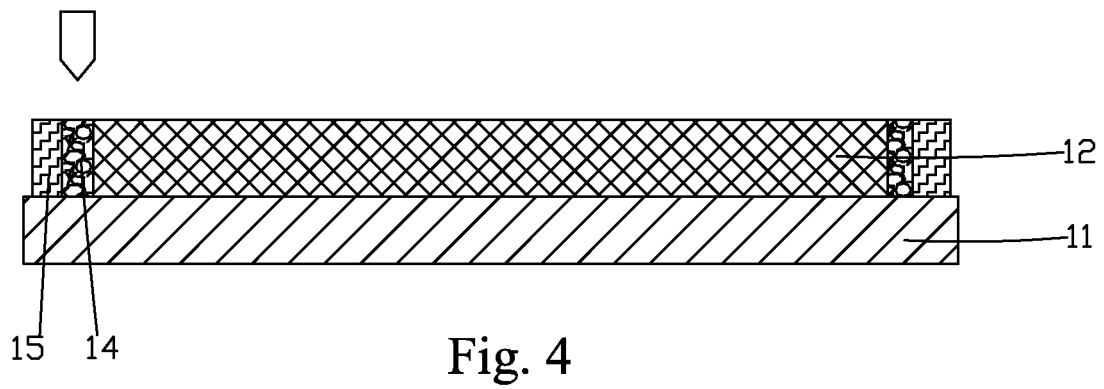
FIG. 4 is a schematic view showing Step 2 of the manufacturing method of package film provided by an embodiment of the present invention.

Step S2: as shown in FIG. 4, forming an organic buffer layer 12 having viscosity on the polymer substrate 11, forming a circle of water absorption layer 14 and a circle of water barrier layer 15 in turn outwardly on periphery of the organic buffer layer 12.

Specifically, the organic buffer layer 12 is formed with a solid film the solid film is a pyrolytic tape, or a pressure sensitive (PSA) type film, and the organic buffer layer 12 is formed by direct adherence of a film; or the organic buffer layer is formed with a liquid glue, the glue comprises one or more of polymethylmethacrylate (PMMA), polystyrene (PS), polydimethylsiloxane (PDMS), and poly Vinyl alcohol (PVA), the organic buffer layer 12 is formed by a coating process, and the coating process is a jet dispensing process, a spin coating process, a screen printing process, or an ink-jet printing process.

Specifically, the water absorption layer 14 is mainly made of calcium oxide, with water absorption capacity reaching 5-10%.

Specifically, the water barrier layer 15 is made of an organic polymer having a high transmittance and having hydrophobicity, such as PDMS glue or DAM glue.

Specifically, the water absorption layer 14 and the water barrier layer 15 are formed by nozzle printing.

Specifically, the organic buffer layer 12 has a thickness of 500-9000 nm.

Specifically, the water absorption layer 14 has a thickness of 100-5000 nm.

Specifically, the water barrier layer 15 has a thickness of 100-5000 nm, the same as the thickness of the water absorption layer 14.

Specifically, Step S2 further comprises performing pre-curing on the organic buffer layer 12, specifically, by UV curing or thermal curing, and further comprises performing pre-curing on the water absorption layer 14 and water barrier layer 15, specifically, by UV curing or thermal curing. The preferred pre-curing process is the thermal curing process.

Step S3: forming an inorganic barrier film, using the viscosity of the organic buffer layer 12 to adhere the inorganic barrier film to the polymer substrate 10, and forming an inorganic barrier layer 13 on the organic buffer layer 12, the water absorption layer 14 and the water barrier layer 15; Specifically, the inorganic barrier layer 13 has a thickness of 100-5000 nm.

Step S4: repeating Steps S2 and S3 at least once to obtain the package film.

Specifically, Steps S2 and S3 are repeated 1-4 times in Step S4 to obtain the package film.

In a preferred embodiment of the manufacturing method of package film of the present invention, the polymer substrate 11 provided in Step S1 is a PET material film.

The organic buffer layer 12 formed in Step S2 is made of a PDMS glue, and Step S2 specifically comprises: coating a PDMS prepolymerization solution to the polymer substrate 11 to form an organic buffer layer 12, forming a circle of water barrier layer 15 surrounding the organic buffer layer 12, and forming a circle of water absorption layer 14 between the organic buffer layer 12 and the water barrier layer 15, and then performing pre-curing on the organic buffer layer 12, the water absorption layer 14, and the water barrier layer 15 to cure the PDMS prepolymerized solution. At this point, the organic buffer layer 12 is a transparent elastomer with a certain viscosity on the surface.

Figure 5:
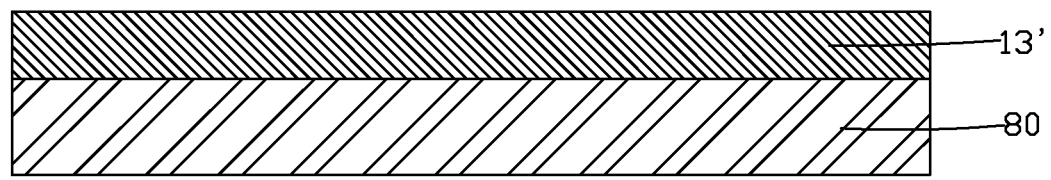
FIGS. 5-7 are view showing Step 3 of the manufacturing method of package film provided by a preferred embodiment of the present invention.

The inorganic barrier layer 13 formed in Step S3 is a graphene film, and the specific process of the step S3 is as follows:

(1). As shown in FIG. 5, preparation of graphene film 13': use a metal nickel plate 80 as the substrate, clean and put into the tube furnace, flow a mixture of methane and hydrogen mixed gas with flow rate of 1.1:1-1.5:1 between methane and hydrogen, use argon for the protection with flow rate of 100-200 sccm; when the temperature reaches 900-1000° C., open the methane and hydrogen flow valve, start the reaction, set the reaction time is 90-120 s, take out of the sample after the end of the cooling, a graphene film 13' is formed on the metal nickel plate 80.

Figure 6:
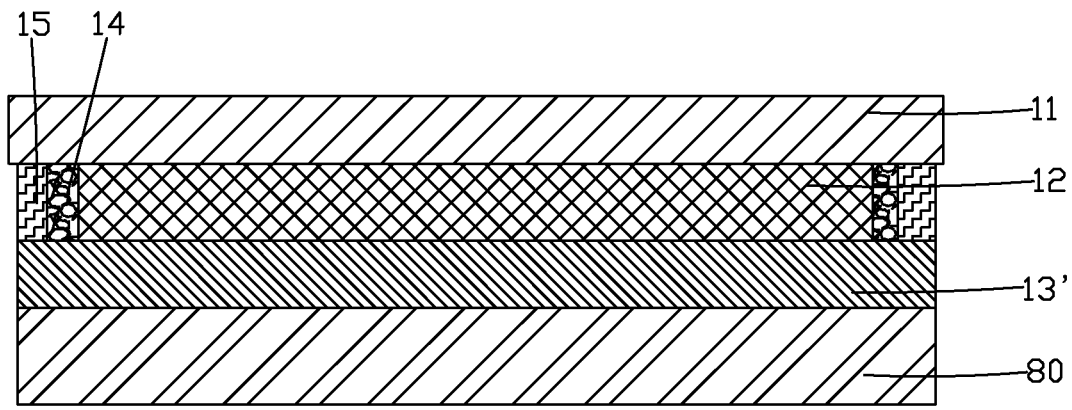

(2). As shown in FIG. 6, attach the polymer substrate 11 after Step S2 to the metal nickel plate 80 so that the viscous organic buffer layer 12 is brought into a tight contact with the graphene film 13', and the entire process is carried out under a nitrogen atmosphere.

Figure 7:
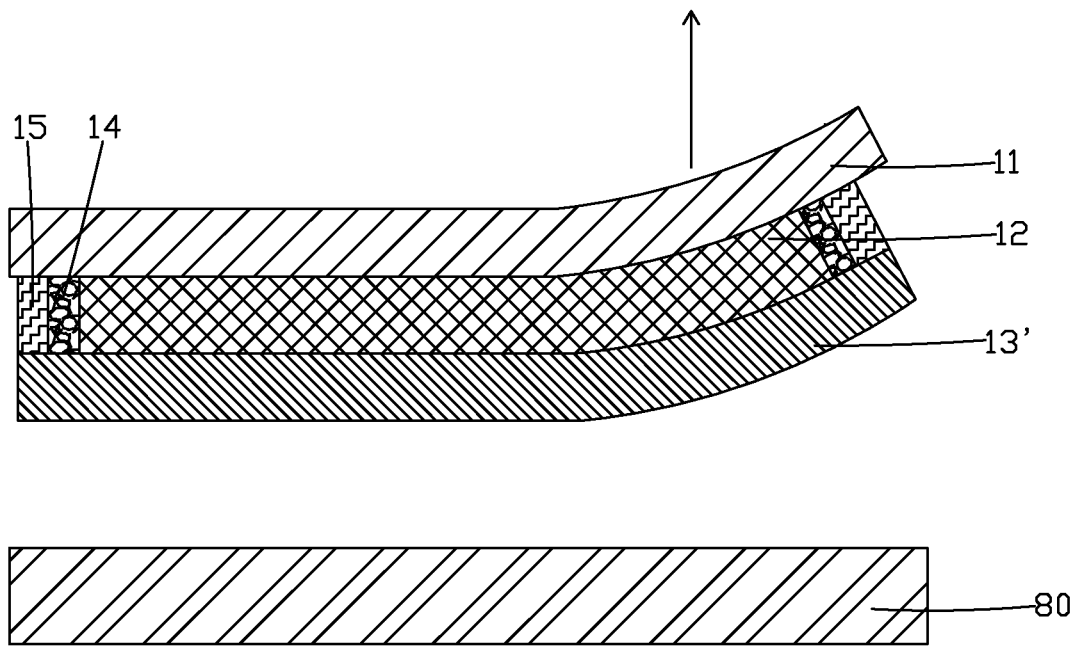

(3). As shown in FIG. 7, the polymer substrate 11 is rapidly removed from the metal nickel plate 80, and the graphene film 13' is adhered to the polymer substrate 11 through the organic buffer layer 12 to obtain an inorganic barrier layer 13.

The manufacturing method of package film of the present invention is simple to operate, able to manufacture package film with high transmittance, high barrier properties, and high flexibility of the package film, and reducing the oxygen permeability of the device as well as reducing the thickness of the package film, making the device thinner, and to meet the flexible OLED panel packaging requirements.

Figure 8:
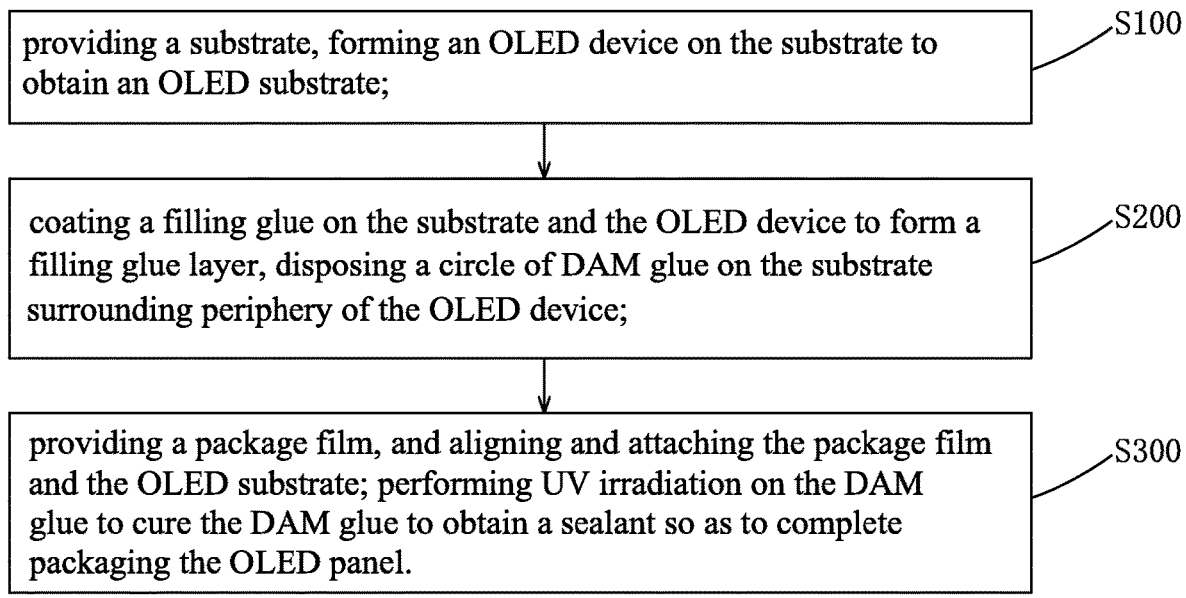
FIG. 8 is a schematic views showing a flowchart of packaging method for OLED panel provided by an embodiment of the present invention.

The package film of the present invention can also easily realize a hybrid packaging structure, such as combining the dam-and-fill packaging, or face sealant packaging. A shown, the applicability of this package film has wide adaptability and numerous options. Therefore, based on the above package film, referring to FIG. 8, the present invention also provides a packaging method of OLED panel, which combines the above package film with a dam-and-fill packaging to encapsulate an OLED panel, comprising the steps of:

Step S100: providing a substrate 20, forming an OLED device 30 on the substrate to obtain an OLED substrate.

Step S200: coating a filling glue on the substrate 20 and the OLED device 30 to form a filling glue layer 41, disposing a circle of DAM glue on the substrate 20 surrounding periphery of the OLED device 30.

Figure 9:
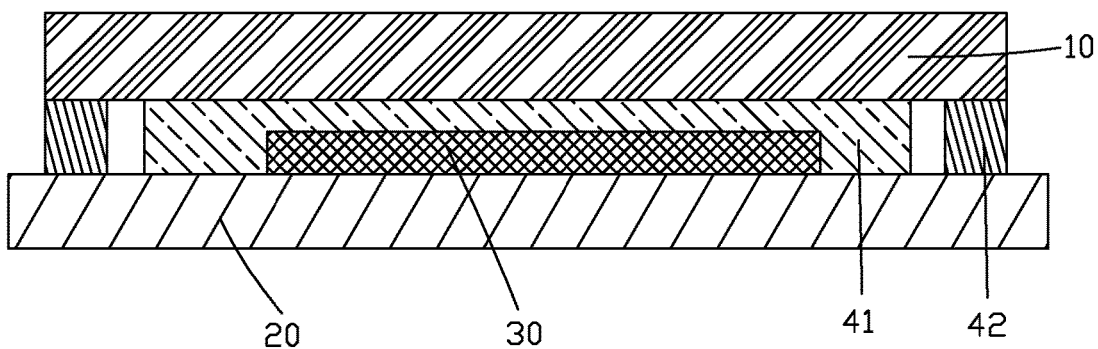
FIG. 9 is a schematic view of Step S300 of FIG. 8.

Step S300: as shown in FIG. 9, providing the above package film 10, and aligning and attaching the package film 10 and the OLED substrate, at this point, the polymer substrate 11 of the package film 10 being at uppermost layer of the OLED device 30, and the inorganic barrier layer 13 at lowermost layer being separated from the OLED device 30 by the filling glue layer; then, performing UV irradiation on the DAM glue surrounding the periphery of the OLED device 30 to cure the DAM glue to obtain a sealant 42, so as to complete packaging the OLED panel. Wherein, the structure of the package film 10 is described as above, and will not be repeated here.

Figure 10:
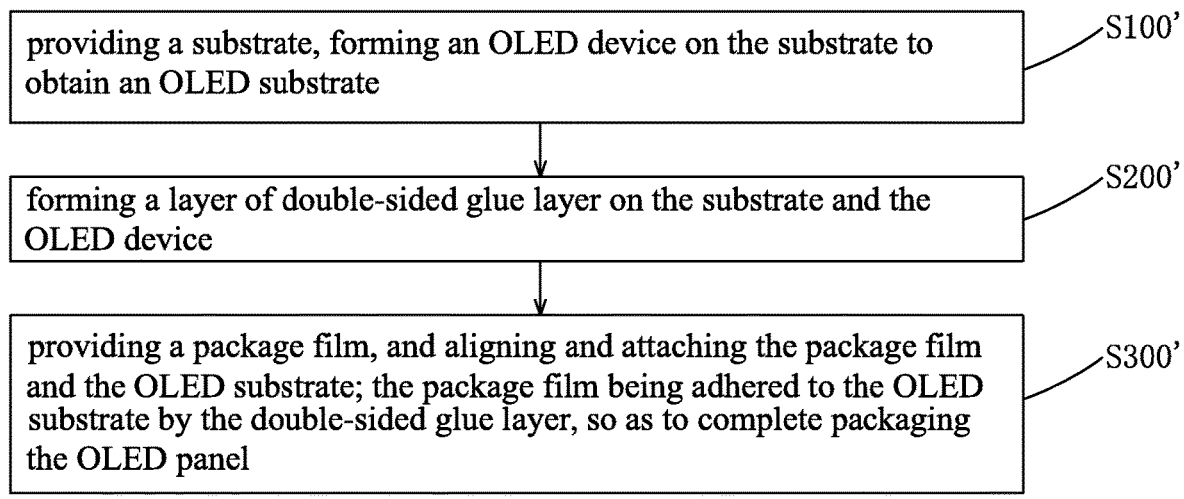
FIG. 10 a schematic views showing a flowchart of packaging method for OLED panel provided by another embodiment of the present invention.

Refer to FIG. 10, the present invention also provides another packaging method of OLED panel, which combines the above package film with a face sealant packaging to encapsulate an OLED panel, comprising the steps of:

Step S100': providing a substrate 20, forming an OLED device 30 on the substrate to obtain an OLED substrate.

Step S200': forming a layer of double-sided glue layer on the substrate 20 and the OLED device 30.

Figure 11:
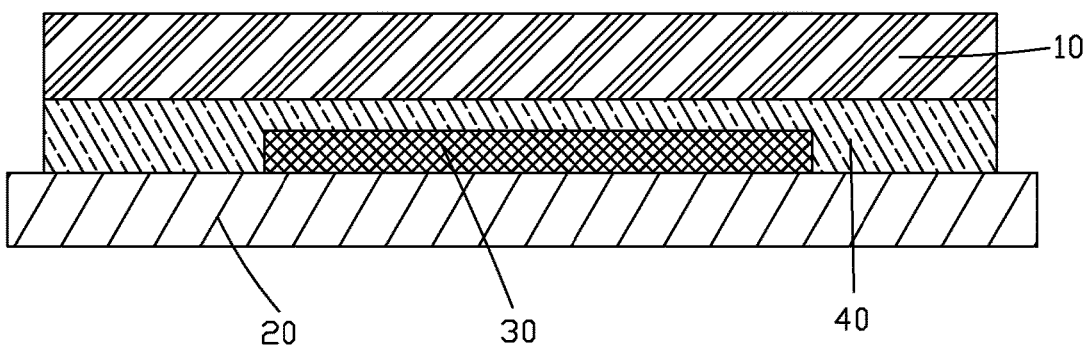
FIG. 11 is a schematic view of Step S300' of FIG. 10.

Step S300': as shown in FIG. 11, providing the above package film 10, and aligning and attaching the package film 10 and the OLED substrate, at this point, the polymer substrate 11 of the package film 10 being at uppermost layer of the OLED device 30, and the inorganic barrier layer 13 at lowermost layer being separated from the OLED device 30 by the double-sided glue layer; then, the package film being adhered to the OLED substrate by the double-sided glue layer, so as to complete packaging the OLED panel. Wherein, the structure of the package film 10 is described as above, and will not be repeated here.

In summary, the package film of the present invention comprises a polymer substrate, at least two organic buffer layers, and at least two inorganic barrier layers; with a single layer of the organic buffer layer and a single layer of the inorganic barrier layer being alternately stacked on the polymer substrate; each organic barrier layer being disposed in turn outwardly with a circle of water absorption layer and a circle of water barrier layer on periphery; the inorganic barrier layer being formed with one or more materials selected from graphene film, mica sheet film, and carbon nanotube film; the organic buffer layer being formed with a material having a viscosity, and the inorganic barrier layer being adhered to the polymer substrate through the viscosity of the organic buffer layer; the present invention utilizes the excellent optical properties and high density of a graphene film, a mica film, and carbon nanotubes film to achieve an excellent-performance package film with transmittance, high barrier, and high flexibility, reduces the device oxygen permeability as well as reduce the package film thickness, to make the device thinner, and to meet the packaging requirements for flexible OLED panel; moreover, by disposing a circle of water absorption layer and a circle of water barrier layer in each organic buffer layer at periphery to enhance the structure of the package film from the lateral side to further improve water and oxygen barrier ability. The manufacturing method of package film of the present invention is, able to manufacture package film with high transmittance, high barrier properties, and high flexibility of the package film, and reducing the oxygen permeability of the device as well as reducing the thickness of the package film, making the device thinner, and to meet the flexible OLED panel packaging requirements. The packaging method for OLED pane of the present invention is, by using the above package film, capable of reducing the oxygen permeability of the device as well as reducing the thickness of the package film, making the device thinner, and to meet the flexible OLED panel packaging requirements to overcome the disadvantages of the conventional thin film packaging and further protects the device.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A package film, comprising: a polymer substrate, at least two organic buffer layers, and at least two inorganic barrier layers;
   wherein the at least two organic buffer layers and the at least two inorganic barrier layers are alternately stacked on the polymer substrate;
   each of the at least two organic buffer layers has a periphery on which a loop of water absorption layer and a loop of water barrier layer are sequentially disposed in a sideway outward direction, wherein the water absorption layer is disposed on and in direct contact with a surface of the periphery of the organic buffer layer and the water barrier layer is disposed on and in direct contact with the water absorption layer;
   each of the at least two inorganic barrier layers is formed of one or more of a graphene film, a mica sheet film, and a carbon nanotube film; and the stack of the at least two inorganic barrier layers and the at least two organic buffer layers is adhered to the polymer substrate through of the at least two organic buffer layers.

2. The package film as claimed in claim 1, wherein each organic buffer layer is formed with a solid film or glue;
   wherein the solid film is a pyrolytic tape, or a pressure sensitive adhesive (PSA) film, and the glue comprises one or more of poly(methyl methacrylate) (PMMA), polystyrene (PS), polydimethylsiloxane (PDMS), and polyvinyl alcohol (PVA).

3. The package film as claimed in claim 1, wherein the water absorption layer is made of calcium oxide; and
   the water barrier layer is made of a polydimethylsiloxane (PDMS) glue, or a dam glue.

4. The package film as claimed in claim 1, wherein the polymer substrate is made of polyimide (PI), polyethylene naphthalate (PEN), polyethylene terephthalate (PET), polybutylene terephthalate (PBT), poly(methyl methacrylate) (PMMA), polystyrene (PS), cycloolefin polymer (COP), or fiber-reinforced thermoplastics (FRT).

5. The package film as claimed in claim 1, wherein the water absorption layer and the water barrier layer are formed by nozzle printing.

6. The package film as claimed in claim 1, wherein the organic buffer layer has a thickness of 500-9000 nm;
   the inorganic barrier layer has a thickness of 100-5000 nm;
   the water absorption layer has a thickness of 100-5000 nm;
   the water barrier layer has a thickness the same as the thickness of the water absorption layer.

7. A manufacturing method of a package film, comprising the steps of:
   Step S1: providing a polymer substrate;
   Step S2: forming an organic buffer layer on the polymer substrate, forming a loop of water absorption layer and a loop of water barrier layer that are sequentially disposed on a periphery of the organic buffer layer in a sideway outward direction, wherein the water absorption layer is disposed on and in direct contact with a surface of the periphery of the organic buffer layer and the water barrier layer is disposed on and in direct contact with the water absorption layer;
   Step S3: forming an inorganic barrier film, using the adhesive property of the organic buffer layer to adhere the inorganic barrier film to the polymer substrate, wherein the inorganic barrier layer is formed on the organic buffer layer, the water absorption layer and the water barrier layer; and
   Step S4: repeating Steps S2 and S3 at least once to obtain the package film.

8. The manufacturing method of the package film as claimed in claim 7, wherein in Step S2, the organic buffer layer is formed with a solid film, wherein the solid film is a pyrolytic tape, or a pressure sensitive adhesive (PSA) film, and the organic buffer layer is formed by direct adherence of the solid film; or,
   the organic buffer layer is formed with a liquid glue, which comprises one or more of poly(methyl methacrylate) (PMMA), polystyrene (PS), polydimethylsiloxane (PDMS), and polyvinyl alcohol (PVA), wherein the organic buffer layer is formed by a coating process, which comprises one of a jet dispensing process, a spin coating process, a screen printing process, and an ink-jet printing process.

9. A packaging method for an organic light-emitting display (OLED) panel, comprising the steps of:
   Step S100: providing a substrate and forming an OLED device on the substrate to obtain an OLED substrate;
   Step S200: coating a filling glue on the substrate and the OLED device to form a filling glue layer and disposing a loop of dam glue on the substrate surrounding a periphery of the OLED device; or,
   forming a double-sided glue layer on the substrate and the OLED device;
   Step S300: providing the package film as claimed in claim 1, and aligning and attaching the package film and the OLED substrate, wherein the polymer substrate of the package film is arranged as an uppermost layer of the OLED device, and one of the inorganic barrier layers that is a lowermost layer of the package film is separated from the OLED device by the filling glue layer or the double-sided glue layer;
   then, performing UV irradiation on the dam glue surrounding the periphery of the OLED device to cure the dam glue to obtain a sealant, or the package film being adhered to the OLED substrate by the double-sided glue layer, so as to complete packaging the OLED panel.

* * * * *